United States Patent
Jung et al.

(10) Patent No.: US 7,749,680 B2
(45) Date of Patent: Jul. 6, 2010

(54) PHOTORESIST COMPOSITION AND METHOD FOR FORMING PATTERN OF A SEMICONDUCTOR DEVICE

(75) Inventors: Jae Chang Jung, Seoul (KR); Sung Koo Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 396 days.

(21) Appl. No.: 11/768,718

(22) Filed: Jun. 26, 2007

(65) Prior Publication Data

US 2008/0166638 A1    Jul. 10, 2008

(30) Foreign Application Priority Data

Jan. 5, 2007 (KR) .................. 10-2007-0001406
Jan. 5, 2007 (KR) .................. 10-2007-0001411
May 17, 2007 (KR) .................. 10-2007-0048216

(51) Int. Cl.
G03F 7/039 (2006.01)
G03F 7/038 (2006.01)
G03F 7/20 (2006.01)
G03F 7/30 (2006.01)
G03F 7/36 (2006.01)

(52) U.S. Cl. .................. 430/270.1; 430/311; 430/313; 430/316; 430/317; 430/318; 430/325; 430/326; 430/330; 430/905; 430/910; 430/921; 430/925

(58) Field of Classification Search .................. None
See application file for complete search history.

(56) References Cited

U.S. PATENT DOCUMENTS 6,153,349 A * 11/2000 Ichikawa et al. ............ 430/170
6,319,654 B1 * 11/2001 Kim et al. .................. 430/296
6,368,773 B1 * 4/2002 Jung et al. .................. 430/281.1

FOREIGN PATENT DOCUMENTS

KR   10-1999-0029309   4/1999
KR   10-2000-00034148  6/2000
KR   10-2004-0061565   7/2004
KR   10-2006-0084051   7/2006

OTHER PUBLICATIONS

Translation of Notice of Rejection for corresponding Korean Application No. 10-2007-0048216, dated Apr. 23, 2008.

* cited by examiner

Primary Examiner—Sin J. Lee
(74) Attorney, Agent, or Firm—Marshall, Gerstein & Borun LLP

(57) ABSTRACT

A photoresist composition includes a base resin, a copolymer of acrylic acid or methacrylic acid and 3,3-dimethoxypropene, a photoacid generator, an organic base, and an organic solvent, and is used for forming a fine (micro) pattern in a semiconductor device by double patterning. The invention method can markedly reduce the number of steps in etching and hard mask deposition processes, so that work hours and manufacturing costs may be reduced, contributing to an increase in yield of semiconductor devices.

15 Claims, 8 Drawing Sheets

PHOTORESIST COMPOSITION AND METHOD FOR FORMING PATTERN OF A SEMICONDUCTOR DEVICE

CROSS-REFERENCE TO RELATED APPLICATION

The priority of Korean patent application numbers 10-2007-1406 and 10-2007-1411, each filed on Jan. 5, 2007, and 10-2007-48216 filed on May 17, 2007, the entire respective disclosures of which are incorporated by reference in their entirety, is claimed.

BACKGROUND OF THE INVENTION

The invention relates to a photoresist composition and a method for forming a pattern in a semiconductor device and, more particularly, to a photoresist composition and a method for forming a fine pattern that overcomes resolution limits of a lithography process during the semiconductor fabricating process.

It is difficult to form line/space patterns of 50 nm or less in size by a one-time exposure using 1.0 (or less) numerical aperture (NA) ArF exposure equipment, even when employing an immersion lithography process. To improve resolution in lithography processes and increase process margins, diversified research on double patterning has been carried out. Double patterning is a process wherein a wafer coated with a photoresist material is exposed using two masks, and then developed. Double patterning is used primarily for complicated patterns (not simple lines or contacts), or for exposure of dense patterns and isolated patterns to increase process margins. The double patterning process involves exposing and etching a first pattern to double its pattern period, and exposing and etching a second pattern having the same pattern period between the first pattern. Since the second mask and etching processes are performed after the first mask and etching processes, a degree of overlay can be measured. In relation to this misalignment and other factors, defects may be overcome and desired resolutions can be obtained. However, this technique increases the number of process steps, thereby complicating semiconductor assembly and increasing production costs.

SUMMARY OF THE INVENTION

The invention provides a photoresist composition and a method for forming a pattern of a semiconductor device employing a double patterning process which comprises a step for forming and curing a first photoresist pattern, followed by forming a second photoresist pattern that does not overlap with the first photoresist pattern, and then etching an underlying layer using the first and second photoresist patterns as an etching mask.

BRIEF DESCRIPTION OF THE DRAWINGS

The invention is described in detail below with reference to the following drawings in which like reference numerals refer to like elements, and wherein.

DETAILED DESCRIPTION OF PREFERRED EMBODIMENTS

Figure 1A:
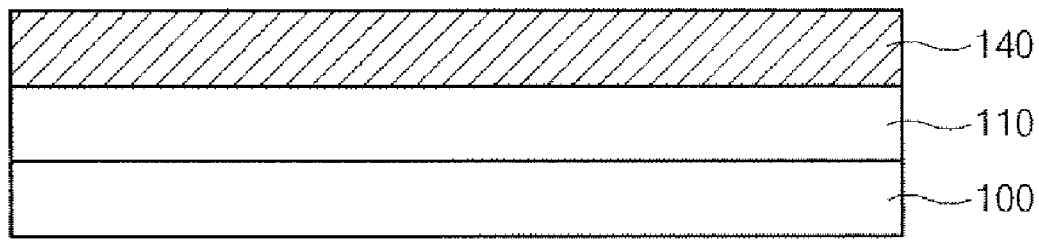
FIGS. 1a to 1e are cross-sectional views, each diagrammatically outlining a double patterning process in a method for forming a pattern according to the invention.

The invention relates to a photoresist composition and a method for forming a pattern of a semiconductor device.

More specifically, the invention provides a photoresist composition useful for the double patterning process, and a method for forming a pattern using a double patterning process.

The photoresist composition of the invention comprises a base resin, a copolymer having repeating units of acrylic acid or methacrylic acid and 3,3-dimethoxypropene, a photoacid generator, an organic base, and an organic solvent.

Preferably, the molar ratio of acrylic acid or methacrylic acid to 3,3-dimethoxypropene in the copolymer is in the range of 0.08:0.92 to 0.15:0.85.

Any suitable photoresist polymer having hydroxyl groups can be used for the base resin. The base resin preferably includes, without limitation, copolymers having repeating units of (t-butyl-2,2,1-bicycloheptane carboxylate/2-hydroxyethyl-2,2,1-bicycloheptane carboxylate/maleic anhydride) or copolymers having repeating units of (2-methyl-2-adamantyl methacrylate/2-hydroxyethyl methacrylate/N-isopropyl acrylamide). Preferably, the molar ratio of t-butyl-2,2,1-bicycloheptane carboxylate to 2-hydroxyethyl-2,2,1-bicycloheptane carboxylate to maleic anhydride is in the range of 0.35~0.45:0.15~0.05:0.5, and the molar ratio of 2-methyl-2-adamantyl methacrylate to 2-hydroxyethyl methacrylate to N-isopropyl acrylamide is in the range of 0.4~0.6:0.4~0.6:0.05~0.10.

Any suitable photoacid generator (i.e., one capable of generating acids by exposure to light), can be used in the photoresist composition of the invention. For example, triphenylsulfonium nonafluorobutane sulfonate, phthalimido trifluoromethane sulfonate, dinitrobenzyltoxylate, n-decyldisulfone, naphtylimido trifluoromethane sulfonate, diphenyliodo hexafluoro phosphate, diphenyliodo hexafluoro arsenate, diphenyliodo hexafluoro antimonite, diphenyl paramethoxyhenylsulfonium triflate, diphenyl paratoluenylsulfonium triflate, diphenyl paraisobutylphenylsulfonium triflate, triphenylsulfonium hexafluoro arsenate, triphenylsulfonium hexafluoro antimonite, triphenylsulfonium triflate, and dibutylnaphtylsulfonium triflate, may be used singly or in combination.

The organic base is any suitable compound functioning as a quencher in the photoresist composition. The organic base preferably includes, without limitation, triethanolamine, triethylamine, tri-isobutylamine, tri-isoctylamine, tri-isodecylamine, or diethanolamine, which maybe singly or in combination.

The organic solvent can be any suitable organic solvent. For example, without limitation, cyclohexanone, diethylene glycol diethylether, methyl 3-methoxypropionate, ethyl 3-ethoxypropionate, propylene glycol methyl ether arsenate, and 2-heptanone are preferred, and may be used singly or in combination.

In the photoresist composition, the base resin is preferably present in an amount ranging from 5 to 20 parts by weight, the copolymer having repeating units of acrylic acid or methacrylic acid and 3,3-dimethoxypropene is preferably present in an amount ranging from 0.2 to 2 parts by weight, the photoacid generator is preferably present in an amount ranging from 0.1 to 0.5 parts by weight, and the organic base is preferably present in an amount ranging from 0.01 to 0.1 parts by weight, all based on 100 parts by weight of the organic solvent. The amount of the solvent is determined empirically based on the desired thickness of the photoresist film, and it is preferred that the solvent be present in an amount ranging from 13 to 19 parts by weight based on 1 part by weight of the total polymer resin (i.e. the base resin plus the copolymer having repeats units of acrylic acid or methacrylic acid and 3,3-dimethoxypropene.)

The invention also provides a method for forming a pattern of a semiconductor.

According to the invention, the method for forming a pattern of a semiconductor device preferably includes the steps of:

sequentially forming an underlying layer and a first photoresist film over a semiconductor substrate, with the underlying layer disposed between the semiconductor substrate and the first photoresist film, said first photoresist film being formed by a photoresist composition comprising a base resin, a copolymer having repeating units of acrylic acid or methacrylic acid and 3,3-dimethoxypropene, a photoacid generator, an organic base, and an organic solvent, as described above;

exposing and developing the first photoresist film to form a first photoresist pattern;

curing the first photoresist pattern;

forming a second photoresist film over the cured first photoresist pattern;

exposing and developing the second photoresist film to form a second photoresist pattern in a manner not overlapping with the first photoresist pattern; and etching the underlying layer by using the first and second photoresist patterns as an etching mask.

The curing step for the first photoresist pattern is preferably carried out at a temperature ranging from 170° C. to 300° C. for 60 seconds to 180 seconds and, highly preferably, at a temperature ranging from 220° C. to 270° C. for 90 seconds to 130 seconds. As a result of the curing step, the first photoresist pattern is not affected by the exposure and developing process of the second photoresist film.

With such a thermal treatment, a methoxy group of the copolymer having repeating units of acrylic acid or methacrylic acid and 3,3-dimethoxypropene is cross-linked with a hydroxyl group in the base resin, thereby forming the cured first photoresist pattern.

Preferably, the second photoresist pattern is formed alternately with the first photoresist pattern. In addition, the first photoresist pattern is preferably arranged at a pitch of 'a', and the first and second photoresist patterns are arranged at a pitch of 'a/2'.

Any suitable photoresist composition may be used to for the second photoresist pattern, and the second photoresist pattern may or may not be cured prior to the etching step.

Preferred embodiments of the invention are described in detail below with reference to the accompanying drawings.

Referring to FIG. 1a, an underlying layer 110 and a first photoresist film 140 using the photoresist composition of the invention are formed at a suitable thickness over a semiconductor substrate 100 coated with another underlying layer (not shown), such as a silicon nitride film.

Figure 1B:
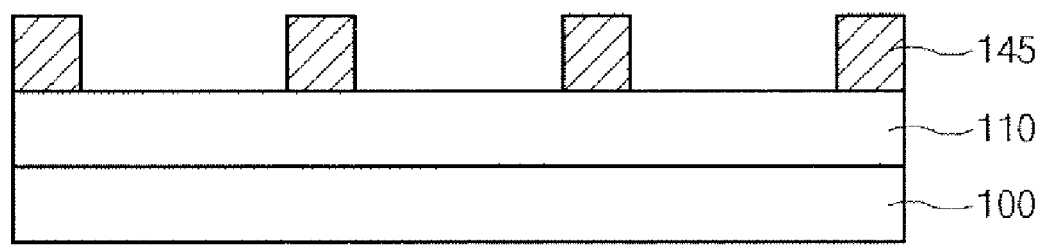
Figure 1C:
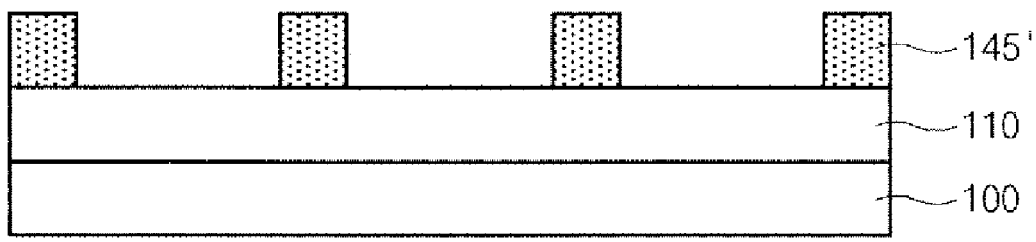

Referring to FIG. 1b, a first region on the surface is exposed by using a first exposure mask (not shown), and the exposed first photoresist film 140 is developed to form a first photoresist pattern 145. Since this is a negative tone double patterning, a resultant pattern has a narrow space portion and the pattern is formed such that the pattern period is doubled.

Referring to FIG. 1, the first photoresist pattern 145 is baked at a predetermined temperature to cure the photoresist. Preferably, the curing process is carried out at a temperature ranging from 170° C. to 300° C. for 60 seconds to 180 seconds and, more preferably, at 220° C. to 270° C. for 90 seconds to 130 seconds. If the curing temperature is below 170° C., the photoresist pattern may not be sufficiently cured, and if the curing temperature is above 300° C., the photoresist may thermally decompose, both of which are undesirable. When the first photoresist pattern is cured under the above-described preferred conditions, a cured first photoresist pattern 145' is not be dissolved with any solvent or developer, therefore the first cured photoresist pattern 145' can retain its original form even though a second photoresist may be coated thereon, exposed, and developed in subsequent process steps.

Figure 1D:
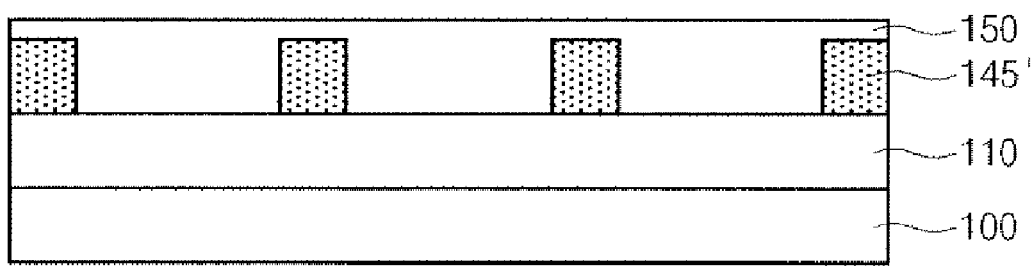
Figure 1E:
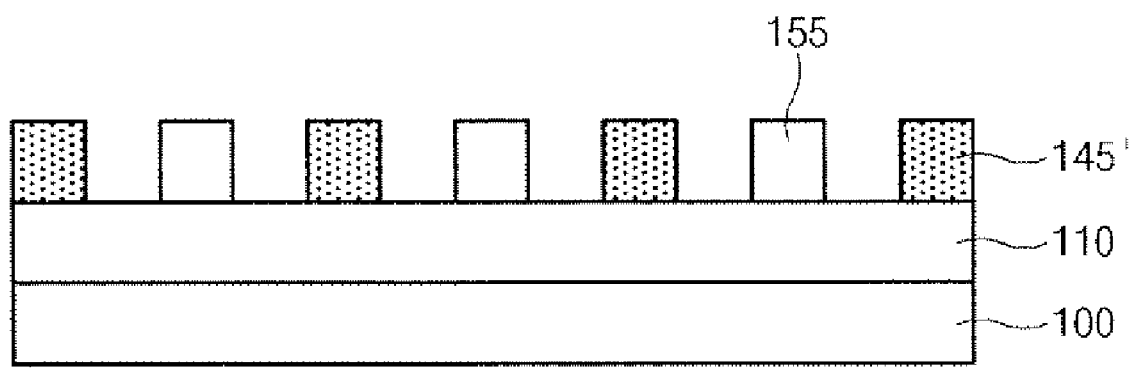

Referring to FIGS. 1d and 1e, a second photoresist film 150 is formed over the cured first photoresist pattern 145', and a second region of the surface is exposed alternately by a second exposure mask (not shown) in such a way as to not overlap with the first region. The second photoresist film 150 is developed to form a second photoresist pattern 155, so that a desired resolution overcoming resolution limits of exposure equipment may be obtained. That is, the first photoresist pattern 145 is arranged at an 'a' pitch, and the first photoresist patter 145 and the second photoresist pattern 155 are arranged at an 'a/2' pitch with respect to each other. The second photoresist may be formed from the same photoresist composition as the first photoresist, or from a different photoresist composition, Finally, the first and second photoresist patterns 145' and 155 are used as an etching barrier film to etch the underlying layer 110, and an underlying layer pattern with a desired resolution is formed.

EXAMPLES

The following examples are provided to further illustrate exemplary embodiments of the present invention.

I. Preparation of Polymer

Preparation Example 1

Synthesis of Poly(t-butyl-2,2,1-bicycloheptane carboxylate/2-hydroxyethyl-2,2,1-bicycloheptane carboxylate/maleic anhydride)

Figure 2:
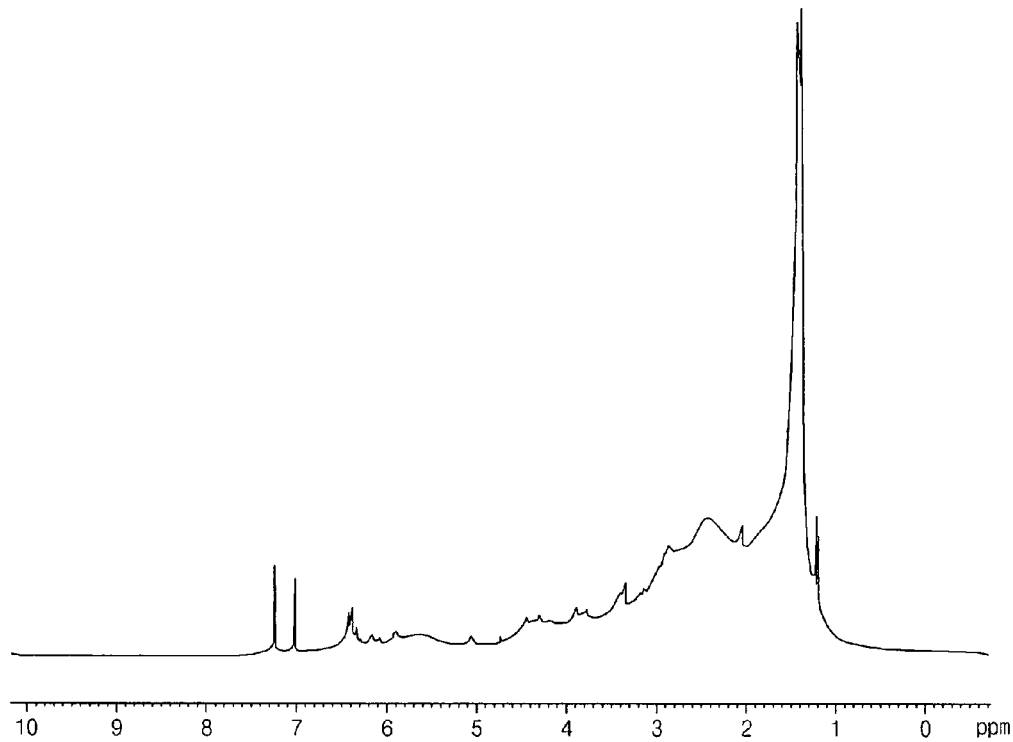
FIG. 2 shows an NMR spectrum of a polymer prepared in Preparation Example 1.

To a 250 ml round-bottomed flask was added t-butyl-2,2,1-bicycloheptane carboxylate (40 g), 2-hydroxyethyl-2,2,1-bicycloheptane carboxylate (9.4 g), maleic anhydride (25.3 g), azobisisobutyronitrile (AIBN) (2,2'-azobisisobutyronitrile) (1.5 g), and propylene glycol methyl ether acetate (50 g), and the mixture was reacted for 8 hours under an $N_2$ atmosphere. When the reaction was complete, the product was precipitated from 1,000 ml diethyl ether, and then dried in vacuum to give a dried polymer (yield: 35%). FIG. 2 shows an NMR spectrum of the titled compound.

Preparation Example 2

Synthesis of Poly(2-methyl-2-adamantyl methacrylate/2-hydroxyethyl methacrylate/N-isopropyl acrylamide)

Figure 3:
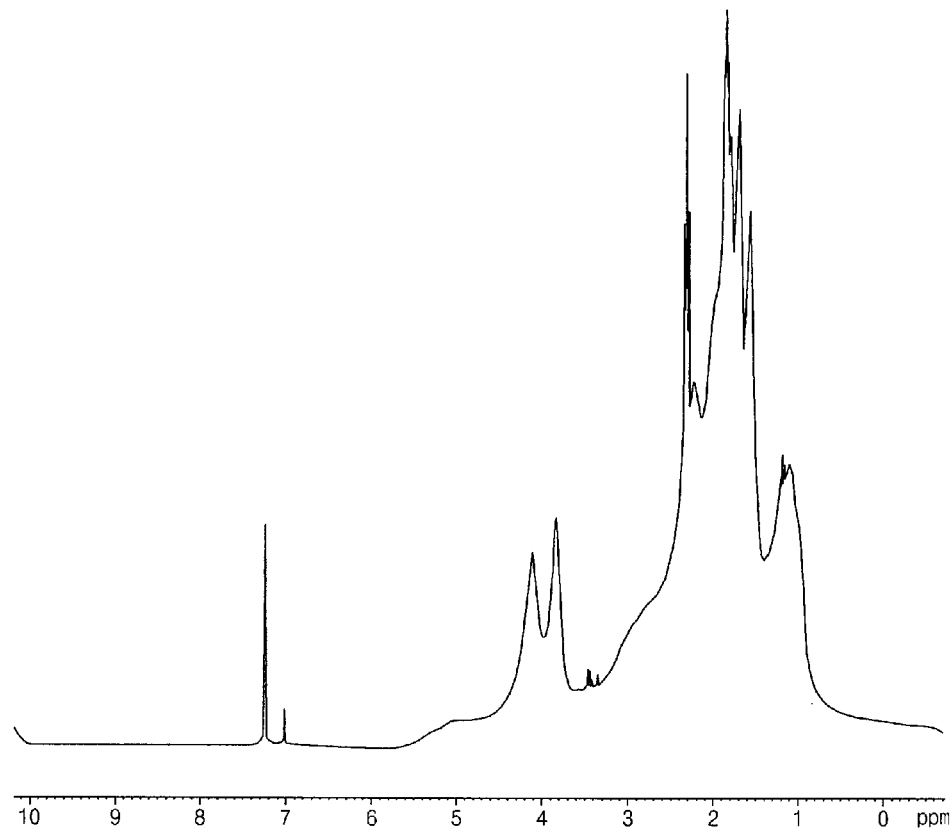
FIG. 3 shows an NMR spectrum of a polymer prepared in Preparation Example 2.

To a 250 ml round-bottomed flask was added 2-methyl-2-adamantyl methacrylate (12 g), 2-hydroxyethyl methacrylate (8 g), N-isopropyl acrylamide (1 g), azobisisobutyronitrile (AIBN) (0.6 g), and propylene glycol methyl ether acetate (100 g), and the mixture was reacted for 8 hours under an $N_2$ atmosphere. When the reaction was complete, the product was precipitated from 1,000 ml diethyl ether, and then dried in vacuum to give a titled polymer (yield: 89%). FIG. 3 shows an NMR spectrum of the titled compound.

Preparation Example 3

Synthesis of Poly(methacrylic acid/3,3-dimethoxypropene)

Figure 4:
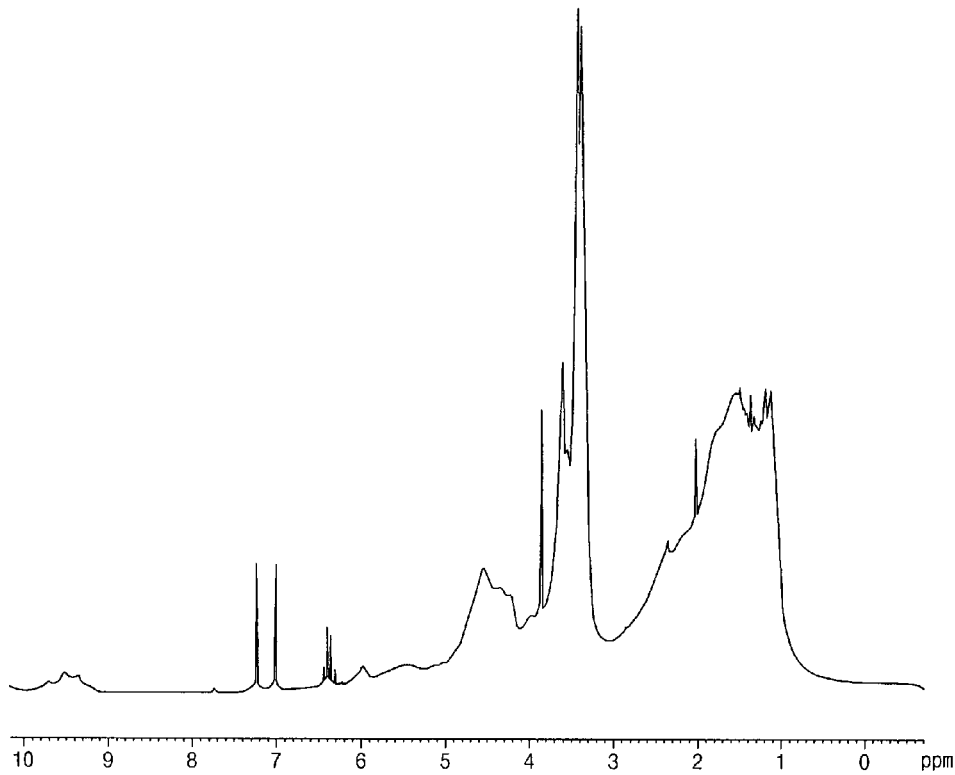
FIG. 4 shows an NMR spectrum of a polymer prepared in Preparation Example 3.

To a 250 ml round bottomed flask was added methacrylic acid (7 g), acrolein (33 g), azobisisobutyronitrile (AIBN) (0.8 g), and propylene glycol methyl ether acetate (90 g), and the mixture was reacted for 8 hours under an $N_2$ atmosphere. When the reaction was complete, the product was precipitated from 1,000 ml diethyl ether, and then dried in vacuum to give poly(methacrylic acid/acrolein) (25 g). To another 250 ml round flask was added the obtained poly(methacrylic acid/acrolein) (25 g), p-toluene sulfonic acid (0.1 g), and methanol (70 g), and the mixture was reacted for 24 hours at 70 oC. When the reaction was complete, the product was precipitated from n-hexane to give the titled polymer (yield: 70%). FIG. 4 shows an NMR spectrum of the titled compound.

II. Preparation of Photoresist Composition

Example 1

Preparation of Photoresist Composition (1)

2.0 g of poly(t-butyl-2,2,1-bicycloheptane carboxylate/2-hydroxyethyl-2,2,1-bicycloheptane carboxylate/maleic anhydride) synthesized in Preparation Example 1, 0.15 g of poly(methacrylic acid/3,3-dimethoxypropene) synthesized in Preparation Example 3, 0.04 g of triphenylsulfonium nonafluorobutane sulfonate, and 0.004 g of triethanolamine were dissolved in 14 g of cyclohexanone to give a photoresist composition of the invention.

Example 2

Preparation of Photoresist Composition (2)

9 g of poly(2-methyl-2-adamantyl methacrylate/2-hydroxyethyl methacrylate/N-isopropyl acrylamide) synthesized in Preparation Example 2, 1 g of poly(methacrylic acid/3,3-dimethoxypropene) synthesized in Preparation Example 3, 0.4 g of triphenylsulfonium nonafluorobutane sulfonate, and 0.04 g of triethanolamine were dissolved in 140 g of cyclohexanone to give a photoresist composition of the invention.

III. Pattern Formation

Example 3

Pattern Formation (1)

A hard mask layer and a bottom antireflection coating were formed over an underlying layer of a semiconductor wafer, and a first photoresist was formed by using the photoresist composition obtained in Example 1. The first photoresist film was prebaked at 110° C. for 60 seconds, overexposed by using an immersion scanner having an exposure mask with 80 nm half pitch, and postbaked at 110° C. for 60 seconds. The first photoresist film was developed in 2.38 wt % aqueous tetramethyl ammonium hydroxide (TMAH) solution to give a first photoresist pattern of 40 nm in size.

Figure 5:
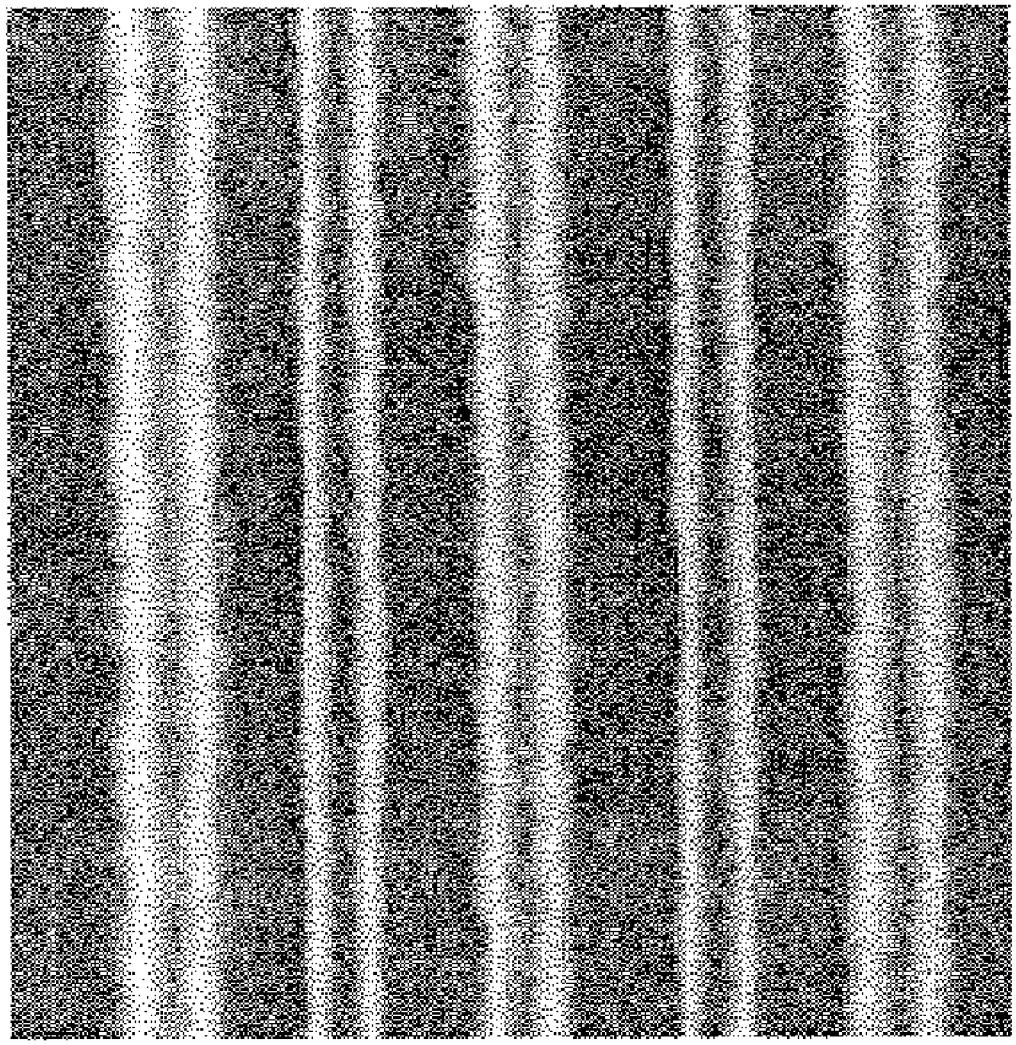
FIG. 5 is an SEM photograph showing a photoresist pattern formed in Example 3.

The patterned wafer was baked at 240° C. for 120 seconds to cure the first photoresist pattern. Then, an AIM5076 photoresist (manufactured by JSR Co., Ltd.) was formed over the cured photoresist pattern as a second photoresist. The second photoresist film was prebaked at 110° C. for 60 seconds, overexposed by using an immersion scanner having an exposure mask with 80 nm half pitch, and postbaked at 115° C. for 60 seconds. The second photoresist film was developed in 2.38 wt % aqueous TMAH solution to give a second photoresist pattern of 40 nm in size. At this time, the second photoresist pattern was formed alternately with the first photoresist pattern. Finally, a photoresist pattern with 40 nm half pitch was formed in use of an exposure mask with 80 nm half pitch (see FIG. 5).

Example 4

Pattern Formation (2)

A hard mask layer and a bottom antireflection coating were formed over an underlying layer of a semiconductor wafer, and a first photoresist was formed by using the photoresist composition obtained in Example 2. The first photoresist film was prebaked at 110° C. for 60 seconds, overexposed by using an immersion scanner having an exposure mask with 80 nm half pitch, and postbaked at 110° C. for 60 seconds. The first photoresist film was developed in 2.38 wt % aqueous tetramethyl ammonium hydroxide TMAH solution to give a first photoresist pattern of 40 nm in size.

Figure 6:
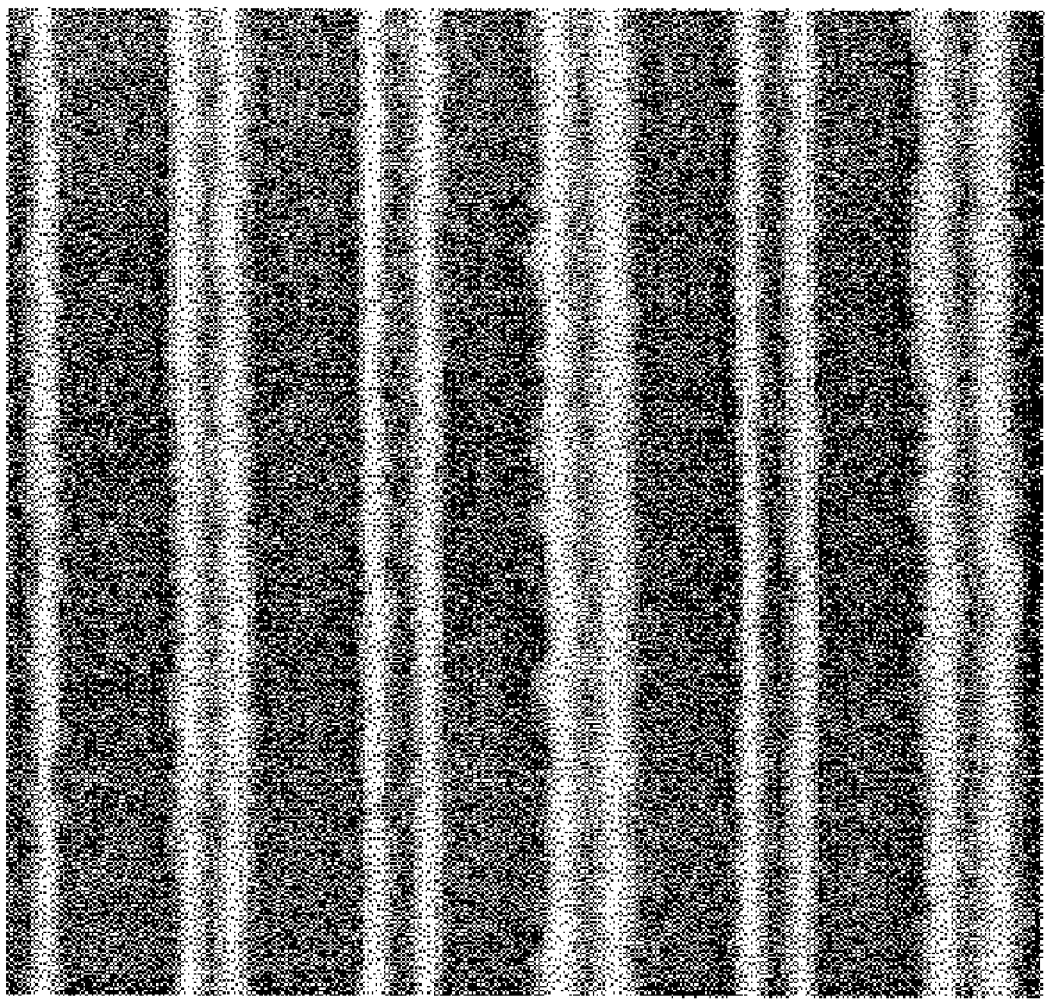
FIG. 6 is an SEM photograph showing a photoresist pattern formed in Example 4.

The patterned wafer was baked at 240° C. for 120 seconds to cure the first photoresist pattern. Then, an AIM5076 photoresist (manufactured by JSR Co., Ltd.) was formed over the cured photoresist pattern as a second photoresist. The second photoresist film was prebaked at 110° C. for 60 seconds, overexposed by using an immersion scanner having an exposure mask with 80 nm half pitch, and postbaked at 115° C. for 60 seconds. The second photoresist film was developed in 2.38 wt % aqueous TMAH solution to give a second photoresist pattern of 40 nm in size. At this time, the second photoresist pattern was formed alternately with the first photoresist pattern. Finally, a photoresist pattern with 40 nm half pitch was formed in use of an exposure mask with 50 nm half pitch (see FIG. 6).

The method for forming a pattern of the invention, compared with a conventional double patterning process, can markedly reduce the etching and hard mask deposition processes, so that working hours and manufacturing costs may be reduced. These contribute to an increase in yield of semiconductor devices, and a 40 nm line/space pattern overcoming resolution limits of exposure equipment can be formed with ease.

While the invention has been described with respect to specific embodiments, various changes and modifications may be made without departing from the spirit and scope of the invention as defined in the following claims.

What is claimed is:

1. A photoresist composition, comprising: a base resin copolymer comprising repeating units selected from group consisting of (t-butyl-2,2,1-bicycloheptane carboxylate/2-hydroxyethyl-2,2,1-bicycloheptane carboxylate/maleic anhydride) and (2-methyl-2-adamantyl methacrylate/2-hydroxyethyl methacrylate/N-isopropyl acrylamide), a first copolymer comprising repeating units of acrylic acid or methacrylic acid and 3,3-dimethoxypropene,
a photoacid generator,
an organic base, and
an organic solvent.

2. The photoresist composition of claim 1, wherein the photoacid generator is selected from the group consisting of triphenylsulfonium nonafluorobutane sulfonate, phthalimido trifluoromethane sulfonate, dinitrobenzyltoxylate, n-decyldisulfone, naphtylimido trifluoromethane sulfonate, diphenyliodo hexafluoro phosphate, diphenyliodo hexafluoro arsenate, diphenyliodo hexafluoro antimonite, diphenyl paramethoxyphenylsulfonium triflate, diphenyl paratoluenylsulfonium triflate, diphenyl paraisobutylphenylsulfonium triflate, triphenylsulfonium hexafluoro arsenate, triphenylsulfonium hexafluoro antimonite, triphenylsulfonium triflate, dibutylnaphtylsulfonium triflate, and combinations thereof.

3. The photoresist composition of claim 1, wherein the organic base is selected from the group consisting of triethanolamine, triethylamine, tri-isobutylamine, tri-isoctylamine, tri-isodecylamine, diethanolamine, and combinations thereof.

4. The photoresist composition of claim 1, wherein the organic solvent is selected from the group consisting of cyclohexanone, diethylene glycol diethylether, methyl 3-methoxypropionate, ethyl 3-ethoxypropionate, propylene glycol methyl ether acetate, 2-heptanone, and combinations thereof.

5. The photoresist composition according to claim 1, wherein the base resin is present in an amount ranging from 5 to 20 parts by weight, the first copolymer comprising repeating units of acrylic acid or methacrylic acid and 3,3-dimethoxypropene is present in an amount ranging from 0.2 to 2 parts by weight, the photoacid generator is present in an amount ranging from 0.1 to 0.5 parts by weight, and the organic base is present in an amount ranging from 0.01 to 0.1 parts by weight, all based on 100 parts by weight of the organic solvent.

6. A method for forming a pattern of a semiconductor device, comprising the steps of:
sequentially forming an underlying layer and a first photoresist film over a semiconductor substrate, with the underlying layer disposed between the semiconductor substrate and the first photoresist film, said first photoresist pattern being formed by a photoresist composition comprising a base resin, a first copolymer comprising repeating units of acrylic acid or methacrylic acid and 3,3-dimethoxypropene, a photoacid generator, an organic base, and an organic solvent;
exposing and developing the first photoresist film to form a first photoresist pattern;
curing the first photoresist pattern;
forming a second photoresist film over the cured first photoresist pattern;
exposing and developing the second photoresist film to form a second photoresist pattern in a manner not overlapping the first photoresist pattern; and
etching the underlying layer by using the first and second photoresist patterns as an etching mask.

7. The method of claim 6, comprising carrying out the curing step at a temperature ranging from 170° C. to 300° C. for 60 seconds to 180 seconds.

8. The method of claim 7, comprising carrying out the curing step at a temperature ranging from 220° C. to 270° C. for 90 seconds to 130 seconds.

9. The method of claim 6, comprising forming the second photoresist pattern alternately with the first photoresist pattern.

10. The method of claim 6, comprising forming the first photoresist pattern at an 'a' pitch, and arranging the first and second photoresist patterns at an 'a/2' pitch with respect to each other.

11. The method of claim 6, wherein the base resin comprises a base resin copolymer comprising repeating units of (t-butyl-2,2,1-bicycloheptane carboxylate/2-hydroxyethyl-2,2,1-bicycloheptane carboxylate/maleic anhydride) or a copolymer comprising repeating units of (2-methyl-2-adamantyl methacrylate/2-hydroxyethyl methacrylate/N-isopropyl acrylamide).

12. The method of claim 6, wherein the photoacid generator is selected from the group consisting of triphenylsulfonium nonafluorobutane sulfonate, phthalimido trifluoromethane sulfonate, dinitrobenzyltoxylate, n-decyldisulfone, naphtylimido trifluoromethane sulfonate, diphenyliodo hexafluoro phosphate, diphenyliodo hexafluoro arsenate, diphenyliodo hexafluoro antimonite, diphenyl paramethoxyphenylsulfonium triflate, diphenyl paratoluenylsulfonium triflate, diphenyl paraisobutylphenylsulfonium triflate, triphenylsulfonium hexafluoro arsenate, triphenylsulfonium hexafluoro antimonite, triphenylsulfonium triflate, dibutylnaphtylsulfonium triflate, and combinations thereof.

13. The method of claim 6, wherein the organic base is selected from the group consisting of triethanolamine, triethylamine, tri-isobutylamine, tri-isoctylamine, tri-isodecylamine, diethanolamine, and combinations thereof.

14. The method of claim 6, wherein the organic solvent is selected from the group consisting of cyclohexanone, diethylene glycol diethylether, methyl 3-methoxypropionate, ethyl 3-ethoxypropionate, propylene glycol methyl ether acetate, 2-heptanone, and combinations thereof.

15. The method of claim 6, wherein the base resin is present in an amount ranging from 5 to 20 parts by weight, the first copolymer comprising repeating units of acrylic acid or methacrylic acid and 3,3-dimethoxypropene is present in an amount ranging from 0.2 to 2 parts by weight, the photoacid generator is present in an amount ranging from 0.1 to 0.5 parts by weight, and the organic base is present in an amount ranging from 0.01 to 0.1 parts by weight, all based on 100 parts by weight of the organic solvent.

* * * * *